US011604551B2

(12) United States Patent
Wang et al.

(10) Patent No.: US 11,604,551 B2
(45) Date of Patent: Mar. 14, 2023

(54) DISPLAY DEVICE COMPRISING DISPLAY SUBSTRATE AND TOUCH CONTROL SUBSTRATE

(71) Applicants: BOE TECHNOLOGY GROUP CO., LTD., Beijing (CN); Chengdu BOE Optoelectronics Technology Co., Ltd., Sichuan (CN)

(72) Inventors: Wei Wang, Beijing (CN); Yi Zhang, Beijing (CN); Yang Zeng, Beijing (CN); Yu Wang, Beijing (CN)

(73) Assignees: BOE TECHNOLOGY GROUP CO., LTD., Beijing (CN); Chengdu BOE Optoelectronics Technology Co., Ltd., Sichuan (CN)

(*) Notice: Subject to any disclaimer, the term of this patent is extended or adjusted under 35 U.S.C. 154(b) by 0 days.

(21) Appl. No.: 17/355,410

(22) Filed: Jun. 23, 2021

(65) Prior Publication Data
US 2022/0206635 A1 Jun. 30, 2022

(30) Foreign Application Priority Data

Dec. 24, 2020 (CN) .......................... 202011545257.7

(51) Int. Cl.
G06F 3/044 (2006.01)
G06F 3/041 (2006.01)
G06K 9/00 (2022.01)
H01L 27/32 (2006.01)
G06V 40/13 (2022.01)
G06V 40/12 (2022.01)

(52) U.S. Cl.
CPC .......... *G06F 3/0446* (2019.05); *G06F 3/0412* (2013.01); *G06V 40/1318* (2022.01); *H01L 27/323* (2013.01); *H01L 27/3218* (2013.01); *H01L 27/3234* (2013.01); *H01L 27/3244* (2013.01); *G06F 3/0443* (2019.05); *G06F 2203/04111* (2013.01); *G06F 2203/04112* (2013.01); *G06V 40/1365* (2022.01)

(58) Field of Classification Search
CPC .... G06F 3/0446; G06F 3/0412; G06F 3/0443; G06F 2203/04112; G06F 2203/04111; H01L 27/3244; H01L 27/3218; H01L 27/3234; H01L 27/323
See application file for complete search history.

(56) References Cited

U.S. PATENT DOCUMENTS

| 2017/0337411 A1* | 11/2017 | Liu | G06V 40/1306 |
| 2019/0319075 A1* | 10/2019 | Lee | H01L 27/322 |
| 2020/0133414 A1* | 4/2020 | Lee | G06F 3/04164 |
| 2021/0004124 A1* | 1/2021 | Park | G06F 3/0446 |

* cited by examiner

*Primary Examiner* — Kwang-Su Yang
(74) *Attorney, Agent, or Firm* — Houtteman Law LLC

(57) ABSTRACT

The present disclose provides a touch control substrate and a display device and relates to the field of touch control technologies. The touch control substrate has a fingerprint recognition area and includes a plurality of touch control electrode units. The touch control electrode unit includes a mesh electrode composed of a plurality of electrode lines, and at least one touch control electrode unit is located in the fingerprint recognition area. The touch control electrode unit in the fingerprint recognition area is divided into a first area and a second area surrounding the first area, and a coverage rate of the plurality of electrode lines in the first area is smaller than a coverage rate of the plurality of electrode lines in the second area.

16 Claims, 7 Drawing Sheets

| | |
|---|---|
| Cm/pF | 1.2338 |
| Cm'/pF | 1.1752 |
| $\triangle$Cm/pF | 0.059 |
| CfTx/pF | 0.351 |
| CfRx/pF | 0.349 |
| LGM | 0.34 |
| Cptx/pF | 13.1 |
| Cprx/pF | 13.2 |
| R tx/Ω | 10.3 |
| R rx/Ω | 12.75 |

Fig. 5a

| | |
|---|---|
| Cm/pF | 1.236 |
| Cm'/pF | 1.175 |
| $\triangle$Cm/pF | 0.061 |
| CfTx/pF | 0.323 |
| CfRx/pF | 0.32 |
| LGM | 0.38 |
| Cptx/pF | 12.2 |
| Cprx/pF | 12.3 |
| R tx/Ω | 9.8 |
| R rx/Ω | 12.2 |

Fig. 5b

| | |
|---|---|
| Cm/pF | 1.233 |
| Cm'/pF | 1.171 |
| △Cm/pF | 0.062 |

Fig. 5c

| | |
|---|---|
| Cm/pF | 1.2341 |
| Cm'/pF | 1.1741 |
| △Cm/pF | 0.06 |

Fig. 5d

| | |
|---|---|
| Cm/pF | 1.338 |
| Cm'/pF | 1.284 |
| △Cm/pF | 0.054 |
| Cptx/pF | 11.1 |
| Cprx/pF | 11.26 |
| R tx/Ω | 11.58 |
| R rx/Ω | 14.1 |

Fig. 6a

| | |
|---|---|
| Cm/pF | 1.18926 |
| Cm'/pF | 1.12617 |
| △Cm/pF | 0.0631 |
| Cptx/pF | 10.8 |
| Cprx/pF | 10.9 |
| R tx/Ω | 14.81 |
| R rx/Ω | 17.9 |

Fig. 6b

| | |
|---|---|
| Cm/pF | 1.18515 |
| Cm'/pF | 1.13898 |
| △Cm/pF | 0.046 |
| Cptx/pF | 10.38 |
| Cprx/pF | 10.53 |
| R tx/Ω | 17.85 |
| R rx/Ω | 24.2 |

Fig. 6c

DISPLAY DEVICE COMPRISING DISPLAY SUBSTRATE AND TOUCH CONTROL SUBSTRATE

CROSS-REFERENCE TO RELATED APPLICATION

This application claims priority to Chinese Patent Application No. 202011545257.7, filed on Dec. 24, 2020, the entire contents of which are hereby incorporated by reference.

TECHNICAL FIELD

The present disclosure relates to the field of touch control technologies, in particular to a touch control substrate and a display device.

BACKGROUND

Fingerprint recognition is to classify and compare fingerprints of an recognized object to perform identification. Fingerprint recognition technology, as one of the biological feature recognition technologies, has gradually matured in the new century and is widely used in many fields.

At present, the conventional fingerprint recognition generally adopts an optical fingerprint recognition technology, and the optical fingerprint recognition technology utilizes an optical sensor to analyze and process light reflected by a finger so as to realize fingerprint recognition. In order to ensure the fingerprint recognition effect of the optical sensor, it is necessary to make the film layer disposed between the optical sensor and the finger have a certain degree of transmittance. However, among the film layers disposed between the optical sensor and the finger, the touch control electrodes (e.g., the driving electrode TX and the sensing electrode RX) for implementing the touch control function are usually made of a metal material, and the transmittance of the touch control electrodes is, however, low due to poor transmittance of the metal material, which is not favorable for the optical sensor to perform fingerprint recognition.

SUMMARY

In an aspect, the present disclosure provides a touch control substrate having a fingerprint recognition area and including a plurality of touch control electrode units, each of the plurality of touch control electrode units including a mesh electrode composed of a plurality of electrode lines. At least one of the plurality of touch control electrode units is in the fingerprint recognition area, a touch control electrode unit of the at least one of the plurality of touch control electrode units is divided into a first area and a second area surrounding the first area, and a coverage rate of the plurality of electrode lines in the first area is smaller than a coverage rate of the plurality of electrode lines in the second area.

In some embodiments, the mesh electrode includes: a first mesh electrode portion in the first area and a second mesh electrode portion in the second area, an area of a mesh of the first mesh electrode portion being larger than an area of a mesh of the second mesh electrode portion.

In some embodiments, a width of an electrode line of the plurality of electrode lines in the first area is smaller than a width of an electrode line of the plurality of electrode lines in the second area.

In some embodiments, the first mesh electrode portion and the second mesh electrode portion are insulated and spaced apart from each other.

In some embodiments, a transition area is provided between the first area and the second area; and a coverage rate of the plurality of electrode lines in the transition area is smaller than or equal to the coverage rate of the plurality of electrode lines in the second area and larger than the coverage rate of the plurality of electrode lines in the first area.

In some embodiments, electrode lines of the plurality of electrode lines in the transition area enclose a plurality of first meshes, and an average area of the plurality of first meshes is equal to an average area of meshes of the second mesh electrode portion.

In some embodiments, the electrode lines in the transition area includes a first electrode line and a second electrode line, the first electrode line is coupled to the first mesh electrode portion, the second electrode line is coupled to the second mesh electrode portion, and the first electrode line is insulated and spaced apart from the second electrode line; and a first mesh of the plurality of first meshes is surrounded by at least one first electrode line and at least one second electrode line.

In some embodiments, the first electrode line and the first mesh electrode portion are of a single-piece structure, and the second electrode line and the second mesh electrode portion are of a single-piece structure.

In some embodiments, a ratio of an area of the first mesh electrode portion to an area of the touch control electrode unit is about 8% to about 24%.

In some embodiments, a width of an electrode line of the plurality of electrode lines is about 3 μm to about 5 μm.

In some embodiments, the first area is in a central area of the touch control electrode unit and includes a plurality of sub-areas separated from each other, and a pattern formed by the plurality of sub-areas is a centrally symmetrical pattern.

In some embodiments, the plurality of touch control electrode units includes a plurality of first touch control electrode units and a plurality of second touch control electrode units, and the first touch control electrode units are insulated and spaced apart from the second touch control electrode units; the plurality of first touch control electrode units are arranged in a plurality of rows, each row has multiple first touch control electrode units arranged therein, and two adjacent first touch control electrode units in a same row are coupled through a bridge electrode; and the plurality of second touch control electrode units are arranged in a plurality of columns, each column has multiple second touch control electrode units arranged therein, and two adjacent second touch control electrode units in a same column are coupled through a connection electrode, the bridge electrode and the connection electrode intersecting with, being insulated and spaced apart from each other.

The present disclosure further provides a display device, including a display substrate and the touch control substrate. The display substrate includes a plurality of sub-pixels and a spacing area that separates the plurality of sub-pixels from each other, and an orthographic projection of the plurality of electrode lines on the display substrate is within the spacing area.

In some embodiments, the plurality of sub-pixels of the display substrate form a plurality of pixel units, each of the plurality of pixel units includes at least three of the plurality of sub-pixels, the at least three sub-pixels in the pixel unit have at least three colors; and a number of colors of sub-pixels surrounded by each mesh of the first mesh electrode portion is larger than a number of colors of sub-pixels surrounded by each mesh of the second mesh electrode portion.

In some embodiments, each mesh of the first mesh electrode portion surrounds sub-pixels having at least two colors, and each mesh of the second mesh electrode portion surrounds a sub-pixel having one color; or each mesh of the first mesh electrode portion surrounds one pixel unit, and each mesh of the second mesh electrode portion surrounds sub-pixels having two colors.

In some embodiments, each of the plurality of pixel units includes a first sub-pixel, a second sub-pixel group, and a third sub-pixel, which are arranged in a first direction.

In some embodiments, the second sub-pixel group includes at least one second sub-pixel arranged in a second direction intersecting the first direction.

BRIEF DESCRIPTION OF THE DRAWINGS

The drawings are used to provide a further understanding of the present disclosure, constitute a part of the specification, and are used to explain the present disclosure together with the following specific embodiments, but do not constitute a limitation to the present disclosure. In the drawings:

FIG. 3a to FIG. 3c are enlarged views of an area D in FIG. 2a;

FIG. 5a is a schematic diagram illustrating simulation results of various touch control parameters of an existing touch control substrate;

FIG. 5b to FIG. 5d are schematic diagrams illustrating simulation results of various touch control parameters of display devices according to embodiments of the present disclosure; and FIGS. 6a to 6c are schematic diagrams illustrating simulation results of various touch control parameters in the case of different electrode line widths according to embodiments of the present disclosure.

DETAILED DESCRIPTION

The specific embodiments of the present disclosure will be described in detail below with reference to the accompanying drawings. It should be understood that the specific embodiments described here are only used to illustrate and explain the present disclosure, and are not used to limit the present disclosure.

Unless otherwise defined, technical or scientific terms used in the embodiments of the present disclosure should have the same meaning as commonly understood by one of ordinary skill in the art to which the present disclosure belongs. The terms "first," "second," and the like, used herein does not denote any order, quantity, or importance, but rather are used to distinguish one element from another. Similarly, the word "include" or "comprise", and the like, means that the element or item preceding the word includes the element(s) or item(s) listed after the word and its equivalent, but does not exclude other elements or items. The terms "connected" or "coupled" and the like are not restricted to physical or mechanical connections, but may include electrical connections, whether direct or indirect. The terms "upper", "lower", "left", "right", and the like are used only to indicate relative positional relationships, and when the absolute position of the object being described is changed, the relative positional relationships may also be changed accordingly.

Figure 1:
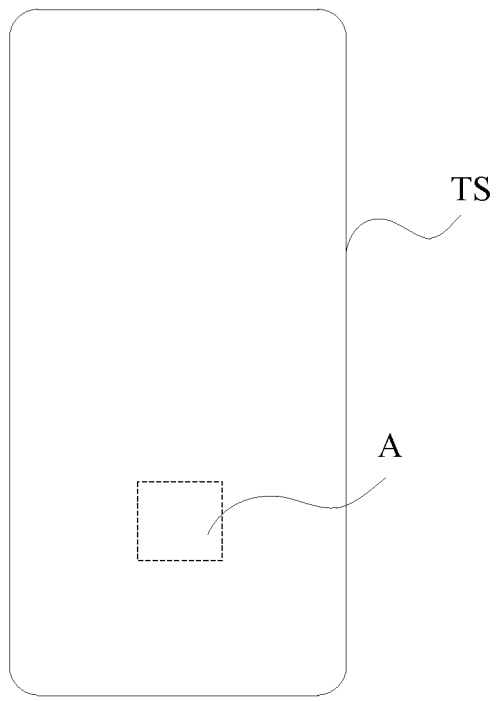
FIG. 1 is a schematic structural diagram of a touch control substrate according to an embodiment of the present disclosure.
Figure 2A:
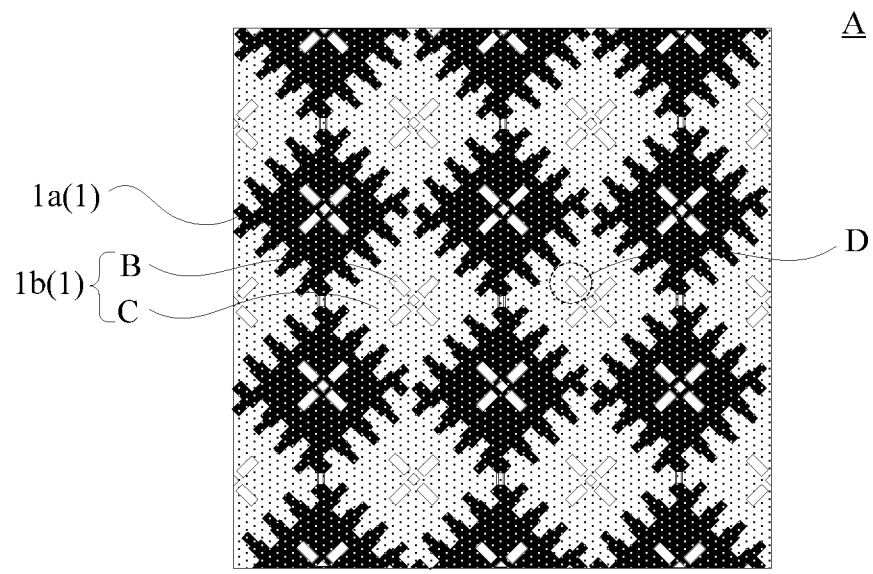
FIG. 2a to FIG. 2c are enlarged views of a fingerprint recognition area A in FIG. 1.
Figure 2B:
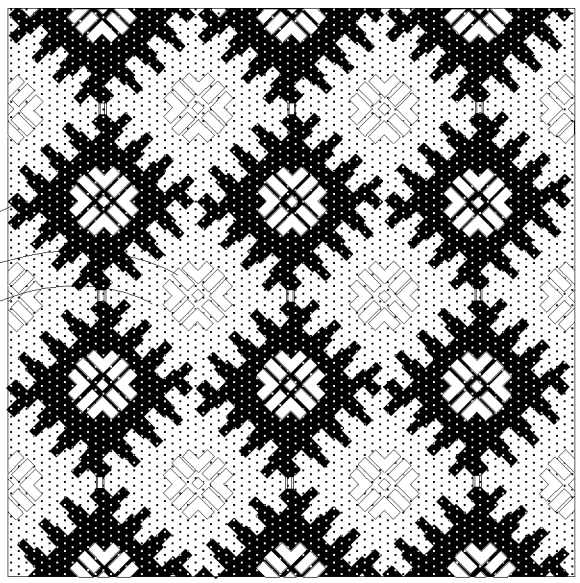
Figure 2C:
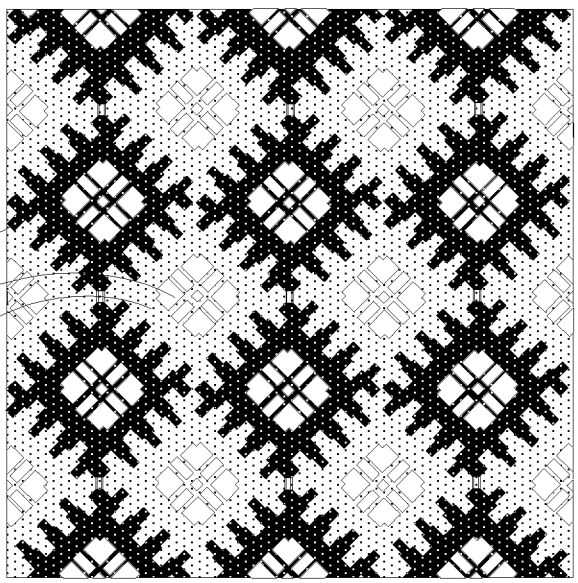

An embodiment of the present disclosure provides a touch control substrate. FIG. 1 is a schematic structural diagram of a touch control substrate according to an embodiment of the present disclosure. FIG. 2a to FIG. 2c are enlarged views of a fingerprint recognition area A in FIG. 1. With reference to FIGS. 1 and 2a to 2c, the touch control substrate TS has a fingerprint recognition area A, the touch control substrate TS includes a plurality of touch control electrode units 1, and each touch control electrode unit 1 includes a mesh electrode composed of a plurality of electrode lines. At least one touch control electrode unit 1 is located in the fingerprint recognition area A. The touch control electrode unit 1 located in the fingerprint recognition area A is divided into a first area B and a second area C surrounding the first area B. The coverage rate of the electrode lines in the first area B is smaller than the coverage rate of the electrode lines in the second area C. In an embodiment of the present disclosure, the touch control substrate TS may be applied to a display device (such as a mobile phone, a tablet computer, etc.) using optical fingerprint recognition. The display device includes a display substrate, and the touch control substrate TS may be disposed on the light-emitting side of the display substrate. The display substrate includes a driving backplane and a light-emitting element arranged on the driving backplane. The light-emitting element is, for example, an organic electroluminescent diode (OLED). The display area of the display substrate includes a plurality of sub-pixels, and each sub-pixel is provided with a light-emitting element and a driving circuit for controlling the light emission of the light-emitting element. The driving circuit may include a thin film transistor and a signal line for transmitting an electrical signal to the thin film transistor. In the display device adopting optical fingerprint recognition, an optical fingerprint recognition module is provided at the position corresponding to the fingerprint recognition area A of the touch control substrate TS (that is, an orthographic projection of the optical fingerprint recognition module on a base substrate of the touch control substrate TS and an orthographic projection of the fingerprint recognition area A on the base substrate of the touch control substrate TS substantially coincides). When a finger is placed on the fingerprint recognition area A, the optical fingerprint recognition module can receive the light reflected by the fingerprint, determine the fingerprint image to be detected according to the light reflected by the fingerprint, compare the fingerprint image to be detected with the preset fingerprint image, and determine whether the fingerprint matching is successful according to the comparison result.

The plurality of touch control electrode units 1 may include a plurality rows/columns of driving electrodes (TX) and a plurality columns/rows of sensing electrodes (RX), each row/column of driving electrodes including a plurality of driving electrode units, and each column/row of sensing electrodes including a plurality of sensing electrode units. The driving electrode and the sensing electrode are insulated and spaced apart from each other, so that a touch control capacitance is formed between the driving electrode and the sensing electrode. When a touch control operation is performed by a touch control object, the touch control capacitance between the driving electrode and the sensing electrode at the corresponding position is changed. The sensing electrode can transmit the change of the touch control capacitance to a touch control detection module, and the touch control detection module can determine the position where the touch control operation is performed based on the change of the touch control capacitance sensed by the sensing electrode RX, thereby realizing touch control detection.

Each of the plurality of touch control electrode units 1 (including the driving electrode units and the sensing electrode units) includes a mesh electrode including a plurality of meshes, and when the touch control substrate TS is disposed on the display substrate for displaying, the meshes of the mesh electrode can expose sub-pixels in the display substrate, so as to prevent the touch control electrode units 1 from interfering with the display of the display substrate. Because the sub-pixels can be exposed by the mesh electrode, the touch control electrode unit 1 may be made of a material with good conductivity and poor transmittance, such as metal, so that the touch control electrode unit 1 has a relatively low resistance, and the effect of the touch control operation can be improved.

In an embodiment of the present disclosure, a coverage rate of the electrode lines in the first area B is smaller than a coverage rate of the electrode lines in the second area C. For example, there are fewer electrode lines arranged in the first area B than in the second area C; alternatively, no electrode line is arranged in the first area B. Since the transmittance of the touch control electrode unit 1 is inversely proportional to the coverage rate of the electrode lines the touch control electrode unit 1, when the coverage rate of the electrode lines in the first area B decreases, the transmittance of the touch control electrode unit 1 increases, and the increase in the transmittance of the touch control electrode unit 1 is beneficial to increasing the intensity of the light received by the fingerprint recognition module, thereby improving the fingerprint detection effect of the fingerprint recognition module.

The specific structure of the touch control electrode unit 1 according to the embodiment of the present disclosure is described in detail with reference to FIGS. 1 to 3c. In some embodiments of the present disclosure, the electrode lines in the first area B may be formed by forming, in the first area B, electrode lines arranged in the same manner as the electrode lines in the second area C and then removing a portion of the electrode lines formed in the first area B, and thus, a difference between the pattern of the electrode lines in the first area B and the pattern of the electrode lines in the second area C may be made small, thereby minimizing the risk of optical visibility of the electrode lines.

Figure 3A:
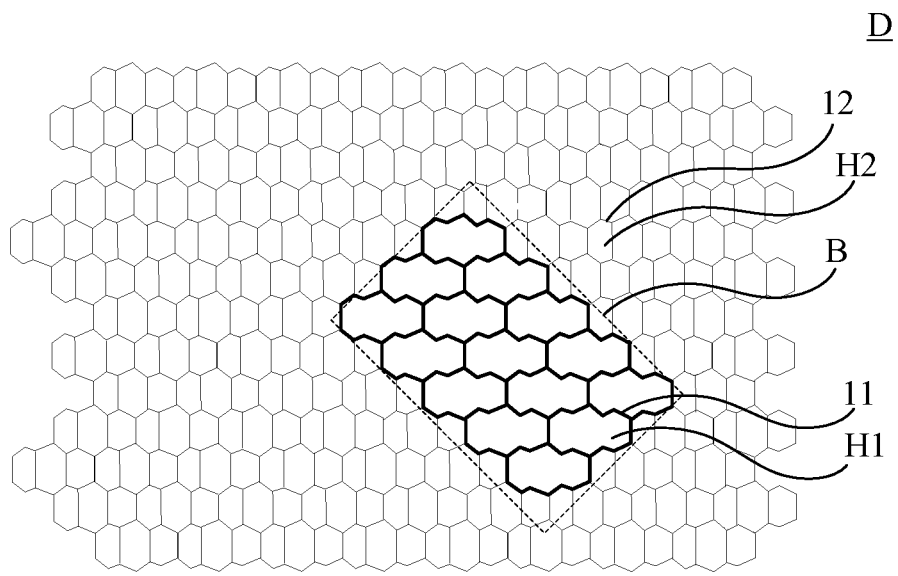
Figure 3B:
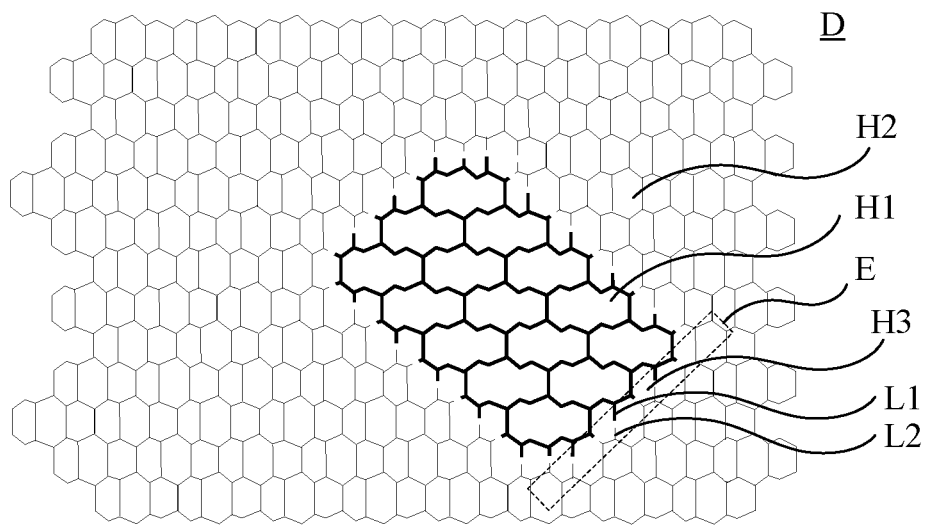
Figure 3C:
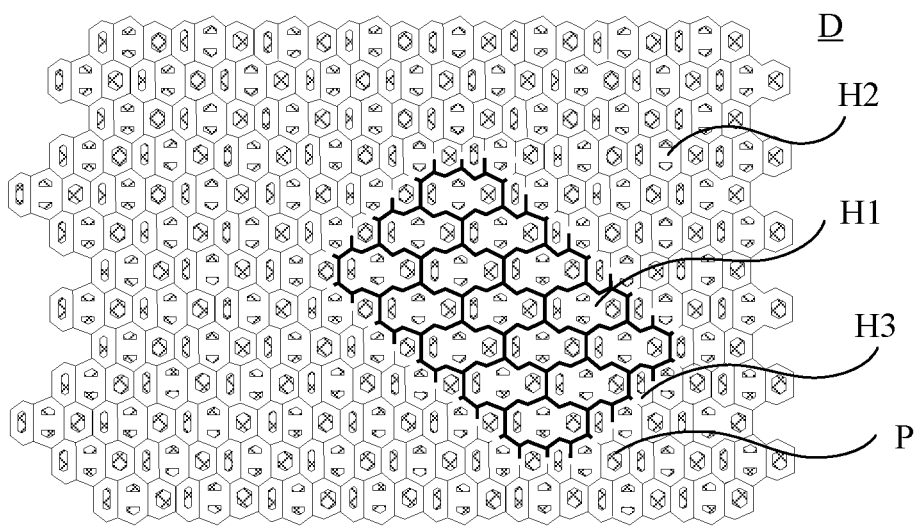

FIGS. 3a to 3c are enlarged views of an area D in FIG. 2a. FIG. 3c schematically illustrates a plurality of sub-pixels P in the display substrate. The plurality of sub-pixels of the display substrate form a plurality of pixel units, and each pixel unit includes sub-pixels P of at least three colors. In some embodiments, each of the plurality of pixel units includes a first sub-pixel having a first color, a second sub-pixel group having a second color, and a third sub-pixel having a third color arranged in a first direction (e.g., a horizontal direction in FIG. 3c). In some embodiments, the second sub-pixel group having the second color includes at least one second sub-pixel having the second color arranged along a second direction (e.g., a vertical direction in FIG. 3c) intersecting the first direction. The first sub-pixel is, for example, a red sub-pixel, the second sub-pixel is, for example, a green sub-pixel, and the third sub-pixel is, for example, a blue sub-pixel.

In an embodiment of the present disclosure, the arrangement of the GGRB may be adopted for the sub-pixels P in the display substrate. The display substrate includes a plurality of repeated pixel units, each pixel unit includes four sub-pixels P, and the four sub-pixels P include: one red sub-pixel, one blue sub-pixel, and two green sub-pixels between the red sub-pixel and the blue sub-pixel. As shown FIGS. 1 to 3b, in some embodiments, the mesh electrode includes a first mesh electrode portion 11 (i.e., the part shown by the thicker line in FIG. 3a) in the first area B and a second mesh electrode portion 12 (i.e., the part shown by the thinner line in FIG. 3a) in the second area C, and an area of the mesh H1 of the first mesh electrode portion 11 is larger than an area of the mesh H2 of the second mesh electrode portion 12.

In an embodiment of the present disclosure, the area of the mesh H1 (or the mesh H2) refers to an area of an orthographic projection of the mesh H1 (or the mesh H2) on the base substrate of the touch control substrate. For a unit area of the first mesh electrode portion 11 (or the second mesh electrode portion 12), the larger the area of the mesh H1 (or the mesh H2), the smaller the area (i.e., the coverage rate) occupied by the electrode lines in the unit area. Therefore, for the first mesh electrode portion 11 and the second mesh electrode portion 12, when the area of the mesh H2 of the first mesh electrode portion 11 is larger than the area of the mesh H2 of the second mesh electrode portion 12, the coverage rate of the electrode lines of the first mesh electrode portion 11 can be made smaller than the coverage rate of the electrode lines of the second mesh electrode portion 12. Thus, compared with the existing touch control substrate in which the entire touch control electrode unit 1 includes the second mesh electrode portion 12 only, the touch control substrate according to the embodiment of the present disclosure can reduce the coverage rate of the electrode lines of the touch control electrode unit 1 by providing the first mesh electrode portion 11, thereby improving the transmittance of the touch control electrode unit 1.

The second mesh electrode portion 12 may adopt a structure of the mesh electrode of an existing touch control substrate, for example, each mesh H2 may surround a single-color sub-pixel(s), such as one sub-pixel P (e.g., a blue sub-pixel or a red sub-pixel) or two sub-pixels P having the same color (e.g., two green sub-pixels), or may surround two sub-pixels P having different colors. In the embodiment of the present disclosure, for the first mesh electrode portion 11, the number of the colors of the sub-pixels surrounded by each mesh H1 is more than the number of the colors of the sub-pixels surrounded by each mesh H2 of the second mesh electrode portion 12. For example, in the case where each mesh H2 surrounds a sub-pixel having a single color, each mesh H1 may surround the sub-pixels having at least two colors, for example, may surround one pixel unit composed of four sub-pixels P, or sub-pixels having two different colors, or two sub-pixels having the same color and one sub-pixel having a different color than said same color, and in the case where each mesh H2 surrounds two sub-pixels P having different colors, each mesh H1 may surround one pixel unit. It can be considered that the first mesh electrode portion 11 has reduced mesh lines extending in the second direction between the sub-pixels of different colors arranged in the first direction in the pixel unit, as compared with the second mesh electrode portion 12, and thus the area of the mesh H1 of the first mesh electrode portion 11 is significantly larger than the area of the mesh H2 of the second mesh electrode portion 12, and meanwhile, with the mesh H1 and the mesh H2 provided in the above manner, the structure of the first mesh electrode portion 11 is similar to the structure of the second mesh electrode portion 12, thereby reducing the risk of optical visibility due to an excessive difference between the first mesh electrode portion 11 and the second mesh electrode portion 12.

It should be noted that, in the embodiment of the present disclosure, the thickness of the line in FIGS. 3a to 3c does not represent the actual width of the electrode line, and the thickness of the line in FIGS. 3a to 3c is only to distinguish the first mesh electrode portion 11 from the second mesh electrode portion 12, and in an actual product, the widths of the electrode lines of the first mesh electrode portion 11 and the electrode lines of the second mesh electrode portion 12 may be the same or different, and may be specifically determined according to actual needs.

For example, in some embodiments, a width of the electrode line in the first area B may be smaller than a width of the electrode line in the second area C, so that the coverage rate of the electrode lines in the first area B may be further reduced.

In some other embodiments, the width of the electrode line in the first area B is smaller than the width of the electrode line in the second area C, however, unlike the above-described embodiments, each mesh H1 of the first mesh electrode portion 11 may have the same structure as each mesh H2 of the second electrode portion 12, that is, each mesh H1 of the first mesh electrode portion 11 surrounds one sub-pixel P or two sub-pixels P having the same color or two sub-pixels P having different colors, thereby making the structures of the first mesh electrode portion 11 and the second mesh electrode portion 12 more similar and minimizing the risk of optical visibility.

In some embodiments, the first mesh electrode portion 11 and the second mesh electrode portion 12 are insulated and spaced apart from each other, and the second mesh electrode portion 12 may not be used for transmitting an electrical signal, so that an overlapping area between an effective portion of the touch control electrode unit 1 for transmitting the electrical signal and an electrode layer (e.g., a cathode layer in an OLED display substrate) in the display substrate may be reduced, thereby reducing a parasitic capacitance between the touch control electrode unit 1 and the electrode layer in the display substrate, which is beneficial to improving the touch control effect.

The electrode lines in the first area B and the second area C may be formed by a single patterning process, however, it is noticed by the inventor of the present application that, due to the fact that the coverage rates of the electrode lines in the first area B and the electrode lines in the second area C are different, a certain difference exists between the pattern corresponding to the first area B and the pattern corresponding to the second area C on a mask plate, and therefore, in the process of performing the patterning process, the electrode lines close to the first area B in the second area C may be affected by the pattern of the portion corresponding to the first area B on the mask plate, so that a portion, which is not desired to be etched, of the electrode lines in the second area C is etched off, and therefore etching uniformity of the electrode lines in the second area C is poor, and further, electrical properties of the electrode lines in the second area C are unstable, and a touch control effect is affected.

In view of above, in some embodiments, as shown in FIG. 3b, a transition area E is further provided between the first area B and the second area C. The coverage rate of the electrode lines in the transition area E is smaller than or equal to that of the electrode lines in the second area C and is larger than that of the electrode lines in the first area B.

In an embodiment of the present disclosure, the coverage rate of the electrode lines in the transition area E is between the coverage rate of the electrode lines in the second area C and the coverage rate of the electrode lines in the first area B; alternatively, the coverage rate of the electrode lines in the transition area E may be the same as the coverage rate of the electrode lines in the second area C. In this way, compare with the difference between the coverage rate of the electrode lines in the first area B and the coverage rate of the electrode lines in the second area C, the difference between the coverage rate of the electrode lines in the transition area E and the coverage rate of the electrode lines in the second area C is less, and consequently, when the etching process is performed, the influence on the electrode lines in the second area C is also less, thereby improving the etching uniformity of the electrode lines in the second area C.

In some embodiments, the electrode lines in the transition area E enclose a plurality of first meshes H3, and an average area of the first meshes H3 may be equal to an average area of the meshes H2 of the second mesh electrode portion 12.

In an embodiment of the present disclosure, the first mesh H3 may have the same structure as the mesh H2 of the second mesh electrode portion 12, that is, each first mesh H3 surrounds one sub-pixel P (e.g., a blue sub-pixel or a red sub-pixel) or two sub-pixels P having the same color (e.g., two green sub-pixels) or two sub-pixels P different colors, so that the pattern of the portion corresponding to the second area C on the mask plate is approximately consistent with the pattern of the portion corresponding to the transition area E on the mask plate, thereby further reducing the influence on the electrode lines in the second area C during the etching process, and maximally improving the etching uniformity of the electrode lines in the second area C.

In some embodiments, the electrode lines in the transition area E include a first electrode line L1 and a second electrode line L2, the first electrode line L1 is coupled to the first mesh electrode portion 11, and the second electrode line L2 is coupled to the second mesh electrode portion 12. The first electrode line L1 is insulated and spaced apart from the second electrode line L2. The first mesh H3 is surrounded by at least one first electrode line L1 and at least one second electrode line L2.

In the embodiments of the present disclosure, the fact that the first mesh H3 is surrounded by the at least one first electrode line L1 and the at least one second electrode line L2 means that the first mesh H3 can be approximately regarded as being surrounded by the at least one first electrode line L1 and the at least one second electrode line L2, and since the first electrode line L1 and the second electrode line L2 are insulated and spaced apart from each other, the first mesh H3 is not a closed pattern in an actual product, and has an opening on a side edge thereof, and the opening makes the first electrode line L1 and the second electrode line L2 be insulated and spaced apart from each other.

In some embodiments, the first electrode line L1 and the first mesh electrode portion 11 are of a single-piece structure, and the second electrode line L2 and the second mesh electrode portion 12 are of a single-piece structure.

In an embodiment of the present disclosure, the first mesh electrode portion 11, the second mesh electrode portion 12, the first electrode line L1, and the second electrode line L2 may all be formed by using the same patterning process. For example, the steps of preparing the first mesh electrode portion 11, the second mesh electrode portion 12, the first electrode line L1, and the second electrode line L2 may include: forming a metal material layer; through the patterning process, removing a portion of the metal material layer in the second area C corresponding to the mesh H2 to obtain the second mesh electrode portion 12, removing a portion of the metal material layer in the first area B corresponding to the mesh H1 to obtain the first mesh electrode portion 11, removing a portion of the metal material layer in the transition area E corresponding to the first mesh H3, and meanwhile, forming openings in the remaining metal material layer in the transition area E, so that a portion of the metal material layer in the transition area E and the first mesh electrode portion 11 are formed to have a single-piece structure, another portion of the metal material layer in the transition area E and the second mesh electrode portion 12 are formed to have a single-piece structure, and the two portions are insulated and spaced apart from each other, thereby obtaining the first electrode line L1 and the second electrode line L2. The steps of preparing the first mesh electrode portion 11, the second mesh electrode portion 12, the first electrode line L1 and the second electrode line L2 by adopting the method are simple, and the production cost is favorably reduced.

In some embodiments, a ratio of the area of the first mesh electrode portion 11 to the area of the touch control electrode unit 1 is about 8% to about 24%. In an embodiment of the present disclosure, the area of the first mesh electrode portion 11 and the area of the touch control electrode unit 1 respectively refer to the area of the orthographic projections of the first mesh electrode portion 11 and the touch control electrode unit 1 on the base substrate of the touch control substrate. In addition, in order to reduce the influence on the touch control function as much as possible, the first area B in the touch control electrode unit 1 may be located in a central area of the touch control electrode unit 1 and include a plurality of sub-areas separated from each other, and the pattern formed by the plurality of sub-areas is a centrally symmetrical pattern, for example, any one of the patterns shown in FIGS. 2a to 2c.

In some embodiments, a width of the electrode line L is about 3 μm to about 5 μm. The term "about" refers to that a value modified by the term is within a measurement error range or an allowable process error, and may be, for example, ±10%.

With the first mesh electrode portion 11 having the above size, the transmittance can be improved while enabling the touch control electrode unit 1 to have a good touch control performance, which will be described in detail below.

In some embodiments, the plurality of touch control electrode units 1 include a plurality of first touch control electrode units 1a and a plurality of second touch control electrode units 1b, and the first touch control electrode units 1a are insulated and spaced apart from the second touch control electrode units 1b. The plurality of first touch control electrode units 1a are arranged in a plurality of rows, each row includes multiple first touch control electrode units 1a arranged therein, and two adjacent first touch control electrode units 1a in the same row are coupled through a bridge electrode. The plurality of second touch control electrode units 1b are arranged in a plurality of columns, each row includes multiple second touch control electrode units 1b arranged therein, and two adjacent second touch control electrode units 1b in the same column are connected through a connection electrode. The bridge electrode and the connection electrode are crossed over, insulated and spaced apart from each other, for example, the bridge electrode and the connection electrode are located in different layers. The first touch control electrode units 1a and the bridge electrodes in the same row constitute a first touch control electrode, and may be formed as a single piece; the second touch control electrode units 1b and the connection electrodes in the same column constitute a second touch control electrode, and may be formed as a single piece. For example, both the bridge electrode and the connection electrode may be of metal mesh structures. One of the first touch control electrode and the second touch control electrode is a touch control driving electrode, and the other is a touch control sensing electrode. Here, the row and the column may be understood as two directions intersecting with each other, and may be, for example, two directions perpendicular to each other.

It should be noted that, in an embodiment of the present disclosure, although not shown in FIGS. 3a to 3c, the electrode lines of the first mesh electrode portion 11 and the second mesh electrode portion 12 may be provided with openings, so that the optical visibility of the electrode lines can be reduced.

The present disclosure also provides a display device, which may be any product or component with a display function, such as electronic paper, a mobile phone, a tablet computer, a television, a display, a notebook computer, a digital photo frame, a navigator and the like. The display device includes a display substrate and the touch control substrate. The display substrate includes a plurality of sub-pixels and a spacing area that separates the plurality of sub-pixels from each other, and an orthographic projection of the electrode lines on the display substrate is located in the spacing area. In an embodiment of the present disclosure, the touch control substrate and the display substrate may be of an ON-CELL structure.

By adopting the display device provided by the embodiment of the present disclosure, the transmittance of the touch control electrode unit can be increased, so that the fingerprint detection effect of the fingerprint recognition module is improved.

In some embodiments, the plurality of sub-pixels of the display substrate form a plurality of pixel units, each pixel unit includes at least three sub-pixels, and the at least three sub-pixels in the pixel unit have at least three colors. The mesh of the first mesh electrode portion may surround sub-pixels having at least two colors in one pixel unit, for example, may surround one pixel unit or sub-pixels having two different colors (e.g., two sub-pixels having different colors) in one pixel unit, and accordingly, in a case where the mesh of the first mesh electrode portion surround one pixel unit, the mesh of the second mesh electrode portion may surround one or two sub-pixels, and in a case where the mesh of the first mesh electrode portion surrounds sub-pixels having two different colors, the mesh of the second mesh electrode portion may surround a sub-pixel(s) having a same color (such as one sub-pixel or two sub-pixels having the same color).

In some embodiments, each of the plurality of pixel units includes a first sub-pixel, a second sub-pixel group, and a third sub-pixel arranged in one direction.

In some embodiments, the second sub-pixel group includes at least one second sub-pixel arranged in another direction intersecting the one direction.

In an embodiment of the present disclosure, each of the plurality of pixel units includes a first sub-pixel, a second sub-pixel group, and a third sub-pixel arranged in a first direction (e.g., a horizontal direction in FIG. 3c). In some embodiments, the second sub-pixel group includes at least one second sub-pixel arranged along a second direction (e.g., a vertical direction in FIG. 3c) intersecting the first direction.

In some embodiments, the display substrate further includes a driving circuit layer for providing a driving signal to the light-emitting element in the sub-pixel, and the driving circuit layer includes a thin film transistor and a signal line for transmitting an electrical signal to the thin film transistor. The materials of the thin film transistor and the signal line each include a metal material.

In the embodiments of the present disclosure, the structure of the touch control substrate may refer to the foregoing description, and is not repeated herein. The transmittance of the fingerprint recognition area of the display device adopting the touch control substrate of the embodiments of the present disclosure is analyzed with reference to FIGS. 2a to 6c.

Figure 4:
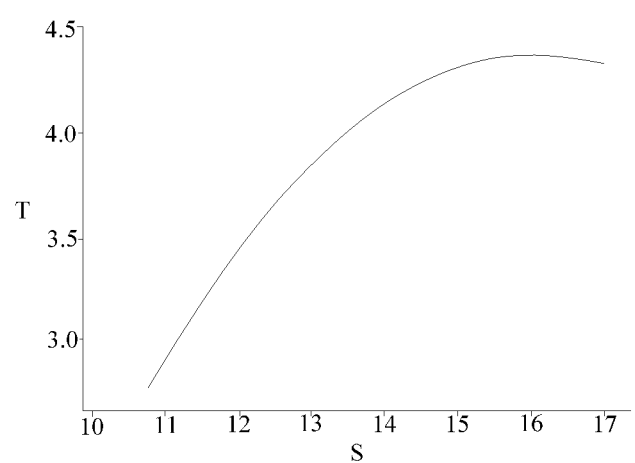
FIG. 4 is a graph illustrating a relationship between a transmittance T of a fingerprint recognition area and an overall aperture ratio S of a display device according to an embodiment of the present disclosure.

In an embodiment of the present disclosure, the plurality of touch control electrode units include a driving electrode (TX) and a sensing electrode (RX). FIG. 5a is a schematic view illustrating simulation results of various touch control parameters of an existing touch control substrate, and FIGS. 5b to 5d are schematic views illustrating simulation results of various touch control parameters of display devices according to embodiments of the present disclosure. In these schematic views, Cm is a mutual capacitance value between a driving electrode and a sensing electrode before a touch control operation is performed, Cm' is a mutual capacitance value between the driving electrode and the sensing electrode after the touch control operation is performed, $\Delta$Cm is a variation of the mutual capacitance value, CfTx is a capacitance value between the driving electrode and a touch control object, CfRx is a capacitance value between the sensing electrode and the touch control object, CpTx is a capacitance value of a parasitic capacitance between the driving electrode and an electrode layer in the display substrate, CpRx is a capacitance value of a parasitic capacitance between the sensing electrode and the electrode layer in the display substrate, Rtx is a resistance of the driving electrode, Rrx is a resistance of the sensing electrode, LGM is a low ground mass parameter, which refers to that the display device and a human body do not share the ground. In a low ground mass state, the retransmission effect is obvious, difficulty in transferring charges from the display device to the ground is increased, a variation of the mutual capacitance which can be acquired by a touch control detection module (TIC) in the display device is small, which results in that it is difficult for the touch control detection module to accurately identify the touch control operation, so that the detection performance on the touch control operation in the low ground mass state is poor. A range of low ground mass parameter which can be processed by the existing touch control detection module is between 0.35 and 0.42, and the low ground mass parameter LGM=$\Delta$Cm/CfTx+$\Delta$Cm/CfRx. FIG. 4 is a graph illustrating a relationship between the transmittance T of the fingerprint recognition area and the overall aperture ratio S of the display device, and as shown in FIG. 4, the transmittance T of the fingerprint recognition area of the display device satisfies that T=−10.65+1.873*(S)−0.05828*(S)^2, where the overall aperture ratio S=S1*S2, S1 is the aperture ratio of the driving circuit layer, and S2 is the aperture ratio of the touch control substrate.

At present, the aperture ratio S1 of the existing driving circuit layer is 15%, as shown in FIG. 5a, the aperture ratio S2 of the existing touch control substrate is 80%, and the transmittance T of the finger print recognition area in the display device is T=−10.65+1.873*(0.15*0.8)−0.05828*(0.15*0.8)^2=3.43%.

In FIG. 2a, the ratio of the area of the first mesh electrode portion 11 to the area of the touch control electrode unit 1 is 8%, and FIG. 5b shows a schematic diagram illustrating simulation results of various touch control parameters when the ratio of the area of the first mesh electrode portion 11 to the area of the touch control electrode unit 1 is 8%. With reference to FIGS. 2a and 5b, compared with the existing touch control substrate, in the touch control substrate of the display device in the embodiment of the present disclosure, Cm, Cm', Rtx, Rrx and $\Delta$Cm are substantially unchanged, while CfTx, CfRx, CpTx and CpRx are all reduced, which is beneficial to increasing the charging and discharging speed of the driving electrode and the sensing electrode, so as to increase the refresh rate. Moreover, the parameter LGM is increased to 0.375, so that the touch control detection is facilitated. The aperture ratio S2 of the touch control substrate is increased to 81%, the aperture ratio S1 of the driving circuit layer is unchanged, and the transmittance T in the fingerprint recognition area of the display device is that T=−10.65+1.873*(0.15*0.81)−0.05828*(0.15*0.81)^2=3.5%, which is 0.07% higher than that of the existing display device.

In FIG. 2b, the ratio of the area of the first mesh electrode portion to the area of the touch control electrode unit 1 is 16%, and FIG. 5c is a schematic diagram illustrating simulation results of various touch control parameters when the ratio of the area of the first mesh electrode portion to the area of the touch control electrode unit 1 is 16%. With the increase of the ratio of the area of the first mesh electrode portion to the area of the touch control electrode unit, Rtx and Rrx are still not significantly changed, while CfTx, CfRx, CpTx and CpRx are all decreased, so that the touch control parameters have little or beneficial effect (for example, the refresh rate is increased) on the touch control performance, and thus, Rtx, Rrx, CfTx, CfRx, CpTx and CpRx are not shown in FIG. 5c. Referring to FIGS. 2b and 5c, compared to the existing touch control substrate, Cm, Cm' and $\Delta$Cm of the touch control substrate of the display device in the embodiment of the present disclosure are still within the ideal range. The parameter LGM is increased to 0.4, so that the touch control detection is facilitated. The aperture ratio S2 of the touch control substrate is increased to 82%, the aperture ratio S1 of the driving circuit layer is unchanged, and the transmittance T in the fingerprint recognition area of the display device is that T=−10.65+1.873*(0.15*0.82)−0.05828*(0.15*0.82)^2=3.57%, which is 0.14% higher than that of the existing display device.

In FIG. 2c, the ratio of the area of the first mesh electrode portion to the area of the touch control electrode unit 1 is 24%, and FIG. 5d is a schematic diagram illustrating simulation results of various touch control parameters when the ratio of the area of the first mesh electrode portion to the area of the touch control electrode unit 1 is 24%. With reference to FIGS. 2c and 5d, with the increase of the ratio of the area of the first mesh electrode portion to the area of the touch control electrode unit, Rtx and Rrx are still not significantly changed, while CfTx, CfRx, CpTx and CpRx are all decreased, so that the touch control parameters have little or beneficial effect (for example, the refresh rate is increased) on the touch control performance, and thus, Rtx, Rrx, CfTx, CfRx, CpTx and CpRx are not shown in FIG. 5d. As shown in FIG. 5d, compared to the existing touch control substrate, Cm, Cm', and $\Delta$Cm of the touch control substrate of the display device in the embodiment of the present disclosure are still within the ideal range. The parameter LGM is increased to 0.42 and reaches the highest, and a further increase in the parameter LGM is not favorable for the touch control detection, so the ratio of the area of the first mesh electrode portion 11 to the area of the touch control electrode unit 1 is 24% at the highest. The aperture ratio S2 of the touch control substrate is increased to 84%, the aperture ratio S1 of the driving circuit layer is not changed, and the transmittance T in the fingerprint recognition area of the display device is T=−10.65+1.873*(0.15*0.84)−0.05828*(0.15*0.84)^2=3.7%, which is 0.27% higher than that of the existing display device, and the improvement is very considerable.

In summary, the display device according to the embodiments of the present disclosure can increase the transmittance of the touch control electrode unit 1 by 0.27% at most, and the improvement effect is excellent.

In some embodiments, the transmittance of the touch control electrode unit 1 may also be improved by reducing the width of the electrode line, for example, the widths of the electrode lines of all the touch control electrode units 1 may be reduced, or the widths of the electrode lines in only the touch control electrode units 1 in the fingerprint recognition area may be reduced. In the embodiment of the present disclosure, as an example, the widths of the electrode lines of only the touch control electrode units 1 in the fingerprint recognition area are reduced. FIGS. 6a to 6c are schematic diagrams illustrating simulation results of various touch control parameters with different electrode line widths according to embodiments of the present disclosure, where the meanings of the touch control parameters are the same as those described with reference to FIGS. 5a to 5d, and are not repeated herein. With reference to FIGS. 6a to 6c, a description will be given in a case where the electrode line of the touch control electrode unit is set to have different widths according to embodiments of the present disclosure.

FIG. 6a is a schematic diagram illustrating simulation results of various touch control parameters when the width of the electrode lines in the touch control electrode unit 1 is 5 μm according to an embodiment of the present disclosure. As shown in FIG. 6a, when the width of the electrode lines is 5 μm, Rtx, Rrx, CpTx, CpRx, Cm', and ΔCm are all within an ideal range, but Cm is 1.338 pF, and a further increase of the width of the electrode line will cause Cm to be too high, which is not favorable for charging and discharging of the driving electrode and the sensing electrode, so the width of the electrode line is up to 5 μm. In this case, the aperture ratio S2 of the touch control substrate is 80%, the aperture ratio S1 of the driving circuit layer is not changed, and the transmittance T=−10.65+1.873*(S)−0.05828*(S)^2=3.43%.

FIG. 6b is a schematic diagram illustrating simulation results of various touch control parameters when the width of the electrode lines in the touch control electrode unit 1 is 4 μm according to an embodiment of the present disclosure. As shown in FIG. 6b, when the width of the electrode lines in the touch control electrode unit 1 is reduced from 5 μm to 4 μm, Cm is reduced from 1.338 pF to 1.189 pF, Cm' is reduced from 1.284 pF to 1.126 pF, CpTx and CpRx are reduced by about 0.3 pF, and the reduction of the foregoing capacitance values is favorable for increasing the refresh rate. ΔCm is increased from 0.058 pF to 0.063 pF, which is favorable for increasing the touch control sensitivity, and Rtx and Rrx are slightly increased, but are also within the design range. The aperture ratio S2 of the touch control substrate is 84%, the aperture ratio S1 of the driving circuit layer is unchanged, and the transmittance T in the fingerprint recognition area of the display device is that T=−10.65+1.873*(0.15*0.84)−0.05828*(0.15*0.84)^2=3.7%.

FIG. 6c is a schematic diagram illustrating simulation results of various touch control parameters when the width of the electrode lines in the touch control electrode unit 1 is 3 μm according to an embodiment of the present disclosure. As shown in FIG. 6c, when the width of the electrode lines in the touch control electrode unit 1 is reduced from 4 μm to 3 μm, ΔCm is reduced to 0.046 pF, Rtx and Rrx are increased significantly, the further reduction of ΔCm and the further increase of Rtx and Rrx are not favorable for the touch control operation, and therefore, the width of the electrode line can be set at 3 μm at the minimum. In this case, the aperture ratio S2 of the touch control substrate is 88%, the aperture ratio S1 of the driving circuit layer is not changed, the transmittance in the fingerprint recognition area of the display device is T=−10.65+1.873*(0.15*0.88)−0.05828*(0.15*0.88)^2=3.9%, and the transmittance is significantly improved.

In summary, the width of the electrode line of the touch control electrode unit in the fingerprint recognition area may be set to be 3 μm to 5 μm, so that the transmittance of the touch control electrode unit is improved on the basis of good touch control performance (the performance is optimal when the width of the electrode line of the touch control electrode unit is set to be 4 μm).

It will be understood that the above embodiments are merely exemplary embodiments adopted to illustrate the principles of the present disclosure, and the present disclosure is not limited thereto. It will be apparent to those skilled in the art that various modifications and improvements can be made without departing from the spirit and scope of the present disclosure, and such modifications and improvements are also considered to be within the scope of the present disclosure.

What is claimed is:

1. A display device comprising a display substrate and a touch control substrate, wherein,
    the touch control substrate having a fingerprint recognition area and comprising a plurality of touch control electrode units, each of the plurality of touch control electrode units comprising a mesh electrode composed of a plurality of electrode lines,
    at least one of the plurality of touch control electrode units is in the fingerprint recognition area, a touch control electrode unit of the at least one of the plurality of touch control electrode units is divided into a first area and a second area surrounding the first area, and a coverage rate of the plurality of electrode lines in the first area is smaller than a coverage rate of the plurality of electrode lines in the second area,
    the display substrate comprises a plurality of sub-pixels and a spacing area that separates the plurality of sub-pixels from each other, and an orthographic projection of the plurality of electrode lines on the display substrate is within the spacing area, the plurality of sub-pixels of the display substrate form a plurality of pixel units, each of the plurality of pixel units comprises at least three of the plurality of sub-pixels, and the at least three sub-pixels in the pixel unit have at least three colors, and
    a number of colors of sub-pixels surrounded by each mesh of a first mesh electrode portion in the first area is larger than a number of colors of sub-pixels surrounded by each mesh of a second mesh electrode portion in the second area.

2. The display device of claim 1, wherein the mesh electrode comprises:
the first mesh electrode portion in the first area and the second mesh electrode portion in the second area, an area of a mesh of the first mesh electrode portion being larger than an area of a mesh of the second mesh electrode portion.

3. The display device of claim 2, wherein a width of an electrode line of the plurality of electrode lines in the first area is smaller than a width of an electrode line of the plurality of electrode lines in the second area.

4. The display device of claim 2, wherein the first mesh electrode portion and the second mesh electrode portion are insulated and spaced apart from each other.

5. The display device of claim 2, wherein:
a transition area is provided between the first area and the second area; and
a coverage rate of the plurality of electrode lines in the transition area is smaller than or equal to the coverage rate of the plurality of electrode lines in the second area and larger than the coverage rate of the plurality of electrode lines in the first area.

6. The display device of claim 5, wherein electrode lines of the plurality of electrode lines in the transition area enclose a plurality of first meshes, and an average area of the plurality of first meshes is equal to an average area of meshes of the second mesh electrode portion.

7. The display device of claim 6, wherein,
the electrode lines in the transition area comprises a first electrode line and a second electrode line, the first electrode line is coupled to the first mesh electrode portion, the second electrode line is coupled to the second mesh electrode portion, and the first electrode line is insulated and spaced apart from the second electrode line; and
each of the plurality of first meshes is surrounded by at least one first electrode line and at least one second electrode line.

8. The display device of claim 7, wherein the first electrode line and the first mesh electrode portion are of a single-piece structure, and the second electrode line and the second mesh electrode portion are of a single-piece structure.

9. The display device of claim 2, wherein a ratio of an area of the first mesh electrode portion to an area of the touch control electrode unit is about 8% to about 24%.

10. The display device of claim 1, wherein a width of an electrode line of the plurality of electrode lines in the first area is smaller than a width of an electrode line of the plurality of electrode lines in the second area.

11. The display device of claim 1, wherein a width of an electrode line of the plurality of electrode lines is about 3 µm to about 5 µm.

12. The display device of claim 1, wherein the first area is in a central area of the touch control electrode unit and comprises a plurality of sub-areas separated from each other, and a pattern formed by the plurality of sub-areas is a centrally symmetrical pattern.

13. The display device of claim 1, wherein;
the plurality of touch control electrode units comprises a plurality of first touch control electrode units and a plurality of second touch control electrode units, and the first touch control electrode units are insulated and spaced apart from the second touch control electrode units;
the plurality of first touch control electrode units are arranged in a plurality of rows, each row has multiple first touch control electrode units arranged therein, and two adjacent first touch control electrode units in a same row are coupled through a bridge electrode; and
the plurality of second touch control electrode units are arranged in a plurality of columns, each column has multiple second touch control electrode units arranged therein, and two adjacent second touch control electrode units in a same column are coupled through a connection electrode, the bridge electrode and the connection electrode being crossed over, insulated and spaced apart from each other.

14. The display device of claim 1, wherein;
each mesh of the first mesh electrode portion surrounds sub-pixels of at least two colors, and each mesh of the second mesh electrode portion surrounds a sub-pixel of one color; or
each mesh of the first mesh electrode portion surrounds one pixel unit of the plurality of pixel units, and each mesh of the second mesh electrode portion surrounds sub-pixels of two colors.

15. The display device of claim 1, wherein each of the plurality of pixel units comprises a first sub-pixel, a second sub-pixel group, and a third sub-pixel, which are arranged in a first direction.

16. The display device of claim 15, wherein the second sub-pixel group comprises at least one second sub-pixel arranged in a second direction intersecting the first direction.

* * * * *

UNITED STATES PATENT AND TRADEMARK OFFICE
CERTIFICATE OF CORRECTION

PATENT NO. : 11,604,551 B2  
APPLICATION NO. : 17/355410  
DATED : March 14, 2023  
INVENTOR(S) : Wei Wang et al.

Page 1 of 1

It is certified that error appears in the above-identified patent and that said Letters Patent is hereby corrected as shown below:

On the Title Page

(71) Applicants should read:  
Chengdu BOE Optoelectronics Technology Co., Ltd., Sichuan (CN)  
BOE TECHNOLOGY GROUP CO., LTD., Beijing (CN)

Signed and Sealed this  
First Day of April, 2025

Coke Morgan Stewart  
*Acting Director of the United States Patent and Trademark Office*